(12) United States Patent
Cheng et al.

(10) Patent No.: US 7,879,672 B2
(45) Date of Patent: Feb. 1, 2011

(54) EDRAM MEMORY CELL STRUCTURE AND METHOD OF FABRICATING

(75) Inventors: Kangguo Cheng, Guilderland, NY (US); Byeong Yeol Kim, Lagrangeville, NY (US); James Patrick Norum, Holmes, NY (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 12/390,739

(22) Filed: Feb. 23, 2009

(65) Prior Publication Data
US 2010/0213523 A1 Aug. 26, 2010

(51) Int. Cl.
*H01L 21/8242* (2006.01)
(52) U.S. Cl. .................... 438/246; 257/E21.653

(58) Field of Classification Search ............ 438/246, 438/248, 389, 391
See application file for complete search history.

(56) References Cited

U.S. PATENT DOCUMENTS

| | | | |
|---|---|---|---|
| 6,355,529 B2 * | 3/2002 | Heo et al. | 438/270 |
| 6,514,816 B2 * | 2/2003 | Lee | 438/243 |
| 6,566,190 B2 * | 5/2003 | Lee et al. | 438/244 |

* cited by examiner

*Primary Examiner*—Chandra Chaudhari
(74) *Attorney, Agent, or Firm*—Ian D. MacKinnon

(57) ABSTRACT

A deep trench structure process for forming a deep trench in a silicon on insulator (SOI) substrate. The SOI substrate has a bulk silicon layer, a buried oxide (BOX) layer and an SOI layer. In the process, the trench fill is recessed only to a level within the SOI layer so as to avoid lateral etching of the BOX layer. The buried strap is then formed followed by the STI oxide.

8 Claims, 8 Drawing Sheets

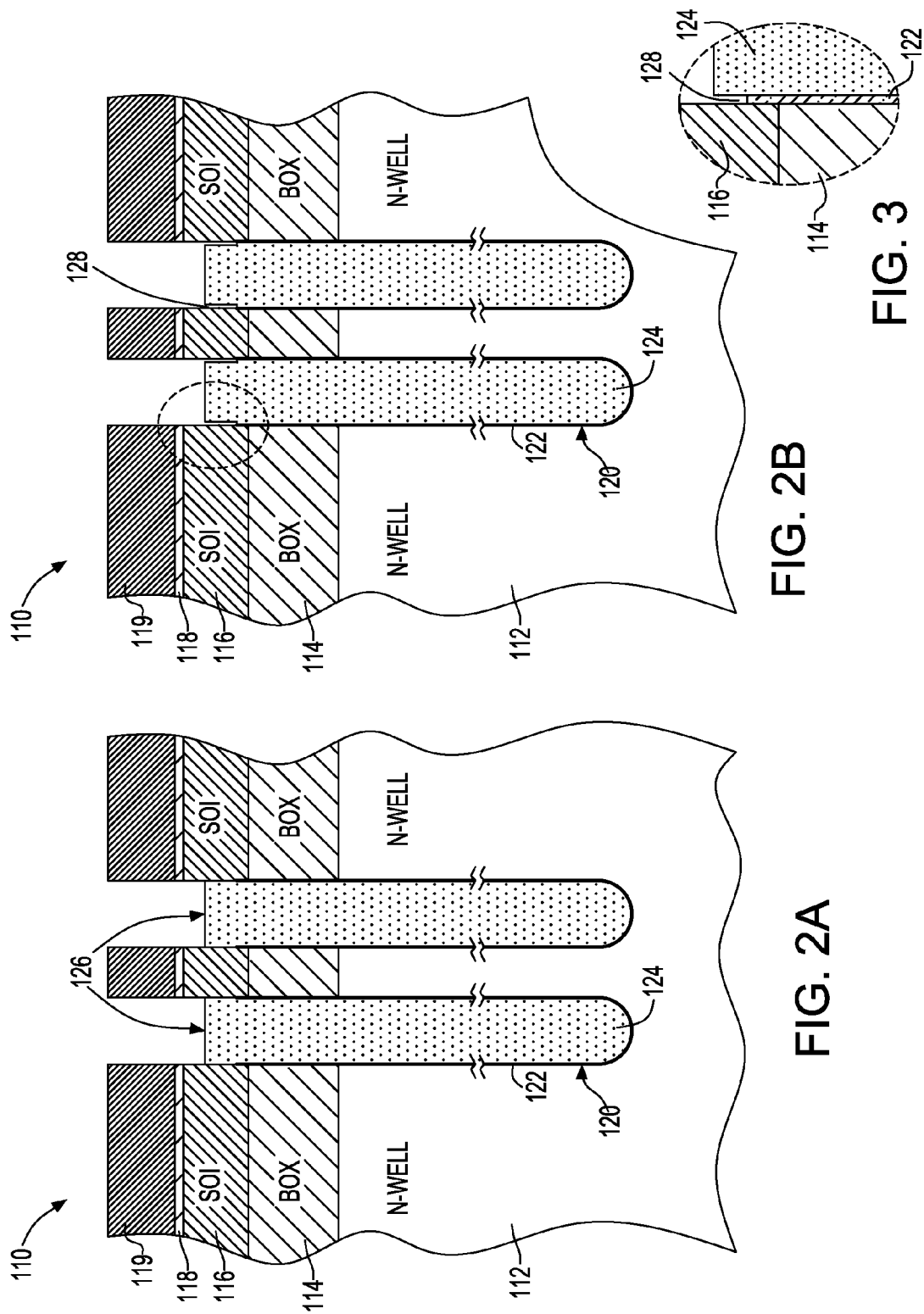

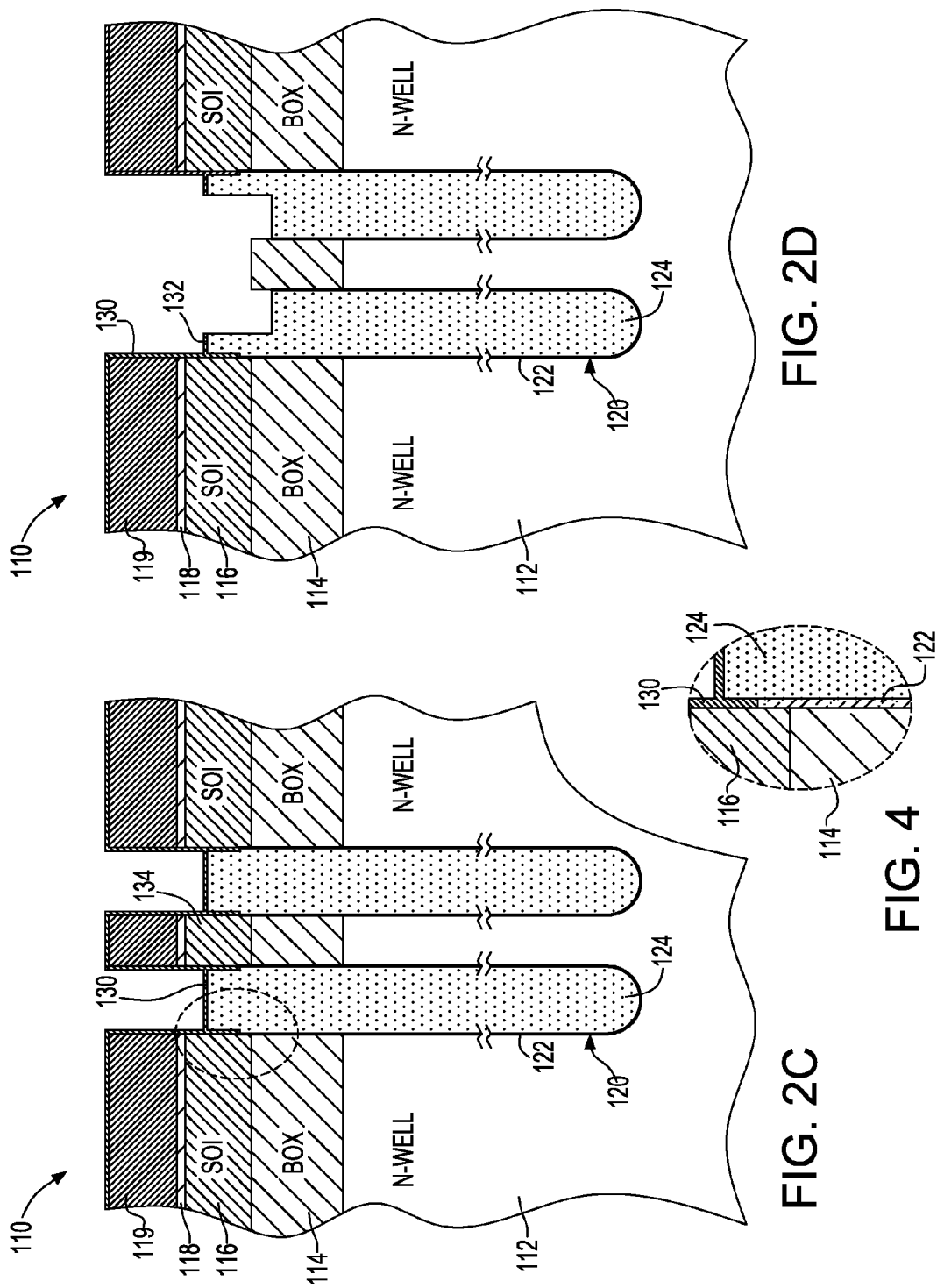

EDRAM MEMORY CELL STRUCTURE AND METHOD OF FABRICATING

BACKGROUND OF THE INVENTION

The present invention relates to electronic devices, and more particularly to memory devices, such as eDRAM devices, formed within a silicon-on-insulator (SOI) substrate.

Dynamic Random Access Memory (DRAM) cells are well known. A DRAM cell is essentially a capacitor for storing charge and a pass transistor (also called a pass gate or access transistor) for transferring charge to and from the capacitor. Data stored in the cell is determined by the absence or presence of charge on the storage capacitor. Because cell size affects chip density, and cost, reducing cell area is one of the DRAM designer's primary goals.

One way to accomplish this density goal without sacrificing storage capacitance is to use trench capacitors in the cells. Trench capacitors can be formed by etching deep trenches in a silicon wafer and forming vertically oriented capacitors within each deep trench. Thus, the surface area required for the storage capacitor is dramatically reduced without sacrificing capacitance, and correspondingly, storable charge. Each deep trench may have a depth on the order of 1 µm or greater.

Trench-type memory devices are advantageous, in comparison to planar memory configurations, for increased density, performance and lithographic considerations. Trench-type memory devices increase density by reducing the cell area of each memory device, therefore allowing for closer positioning of adjacent memory devices.

There is interest in integrating the excellent drive current and density of memory devices with the superior logic devices that can be formed on silicon-on-insulator (SOI) substrates, to obtain high density memory embedded dynamic random access memory (eDRAM). SOI substrates reduce parasitic capacitance within the integrated circuit and reduce individual circuit loads, thereby improving circuit and chip performance.

With eDRAM on an SOI substrate, the buried oxide (BOX) is used as a collar oxide, simplifying the overall fabrication process. However, the collar oxide can be attacked easily during wet processing, especially during node dielectric material removal before strap deposition.

Accordingly, there is a need for an improvement in the design and manufacturing of eDRAM on SOI substrates to protect the BOX during processing.

BRIEF SUMMARY OF THE INVENTION

The invention has been achieved by providing, according to a first aspect of the invention, a method for forming an eDRAM memory cell structure comprising the steps of:

forming a trench in a silicon on insulator (SOI) substrate comprising a bulk silicon layer, a buried oxide (BOX) layer and an SOI layer, the trench formed to a depth extending through the SOI layer and the BOX layer of the SOI substrate;

forming a node dielectric in the trench;

filling the trench with a first fill material;

recessing the first fill material to a level within the SOI layer;

recessing the node dielectric to form a divot;

filling the divot and forming a buried strap on the first fill material for making an electrical connection between the SOI layer and first fill material;

filling the trench with a second fill material; and forming a gate on the SOI layer and a passing wordline on the second fill material.

According to a second aspect of the invention, there is an eDRAM memory cell structure comprising:

a silicon on insulator (SOI) substrate comprising a bulk silicon layer, a buried oxide (BOX) layer and an SOI layer;

a trench extending through the SOI layer, BOX layer and into the bulk silicon layer, the trench comprising a node dielectric and a doped polysilicon fill;

the node dielectric having a divot within the level of the SOI layer in which a buried strap is formed to connect the trench polysilicon fill and the SOI layer.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 2A to 2G illustrate a method according to the present invention of forming an eDRAM memory cell structure.

FIG. 3 is an enlarged view of a feature shown circled in FIG. 2B.

FIG. 4 is an enlarged view of a feature shown circled in FIG. 2C.

DETAILED DESCRIPTION OF THE INVENTION

Figure 1A:
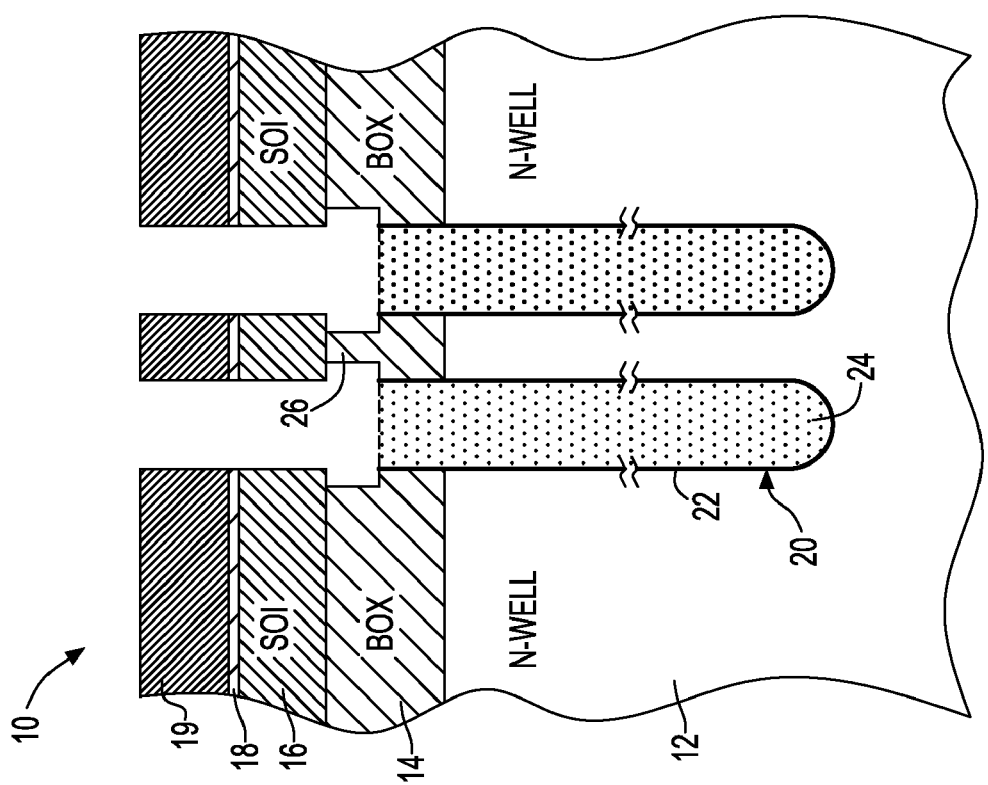
FIGS. 1A to 1D illustrate a prior art method of forming an eDRAM memory cell structure.

Referring to the drawings in more detail, and particularly referring to FIG. 1A, there is shown a partially fabricated eDRAM memory cell structure on a silicon on insulator (SOI) substrate 10 which comprises bulk silicon 12, buried oxide layer 14 and SOI layer 16.

The SOI substrate 10 is fabricated using techniques well known to those skilled in the art. For example, the SOI substrate 10 can be formed by a thermal bonding process, a layer transfer process, or alternatively, the SOI substrate 10 can be formed by an oxygen implantation process, which is referred to in the art as separation by implantation of oxygen (SIMOX).

The SOI layer 16 is a silicon-containing layer and may include any semiconductor material that includes silicon. Illustrative examples of various silicon semiconductor materials that can be employed include, but are not limited to, Si, SiGe, SiGeC, SiC and other like Si-containing materials. Combinations of the aforementioned semiconductor materials can also be used as the SOI layer 16.

The SOI layer 16 is doped to provide suitable electrical conductivity. Conventional processes, such as ion implantation, may introduce the dopant. Alternatively, the SOI layer 16 can be in-situ doped.

Formed over the SOI layer 16 is pad oxide layer 18 and masking layer 19 is, for example, a nitride layer which forms a hard mask to facilitate the formation of the eDRAM memory cell structure. Deep trenches 20 are then formed in the SOI substrate 10 using an etch process that is highly selective to the masking layer 19, such as reactive ion etching. The typical deep trench etch process can involve another layer of hard mask formation on top of the pad nitride layer (masking layer 19) for deeper trench depth, which is not shown in FIG. 1A for the clear explanation of the concept of the present invention. The two deep trenches 20 are lined with a node dielectric 22. The node dielectric 22 may be conformally formed along the walls of the deep trenches 20 using deposition methods such as chemical vapor deposition (CVD) or plasma-enhanced CVD (PECVD). The node dielectric may be, for example, a metal oxide or a nitride oxide. The deep trenches 20 are filled with doped polysilicon 24. The doped polysilicon 24 may be deposited by a process such as CVD or low pressure CVD (LPCVD).

Following deposition of the doped polysilicon 24, the doped polysilicon 24 and node dielectric 22 are then recessed with a dry and a wet etch process, respectively. During the step of recessing the node dielectric 22 and polysilicon 24, the BOX layer 14 is also laterally etched which thins the BOX layer 26 between adjacent trenches 20.

Figure 1B:
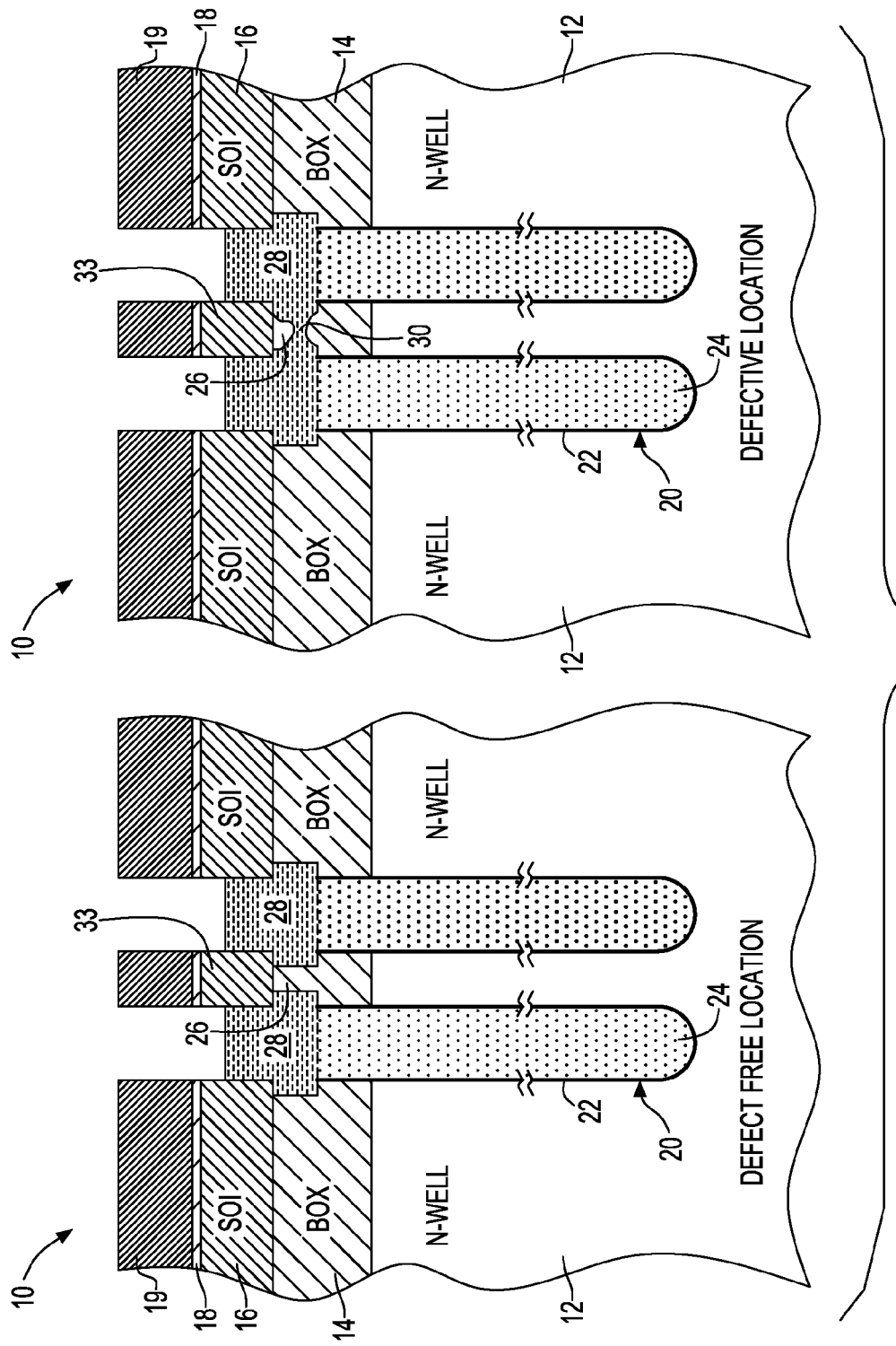

Referring now to FIG. 1B, doped polysilicon 28 is added to the trenches 20 and then conventionally recessed to form a so-called buried strap, which connects the SOI and trench electrode by a portion of trench capacitor electrode 28. The left side of FIG. 1B shows a defect free structure wherein there is sufficient BOX layer 26 between adjacent trenches 20 although it is noticeably thinned. The right side of FIG. 1B shows a defective structure. Due to tight tolerances, the previously mentioned lateral etching of the BOX layer 14 can cause breakthrough 30 of the BOX layer 14 between adjacent trenches 20. When the doped polysilicon 28 is added to the trench 20, some of the doped polysilicon 28 may enter the breakthrough area 30 so that there is a short formed between adjacent trenches 20. Such a defect will cause the cell to fail and is thus to be avoided if possible.

Figures 1C, 1D:
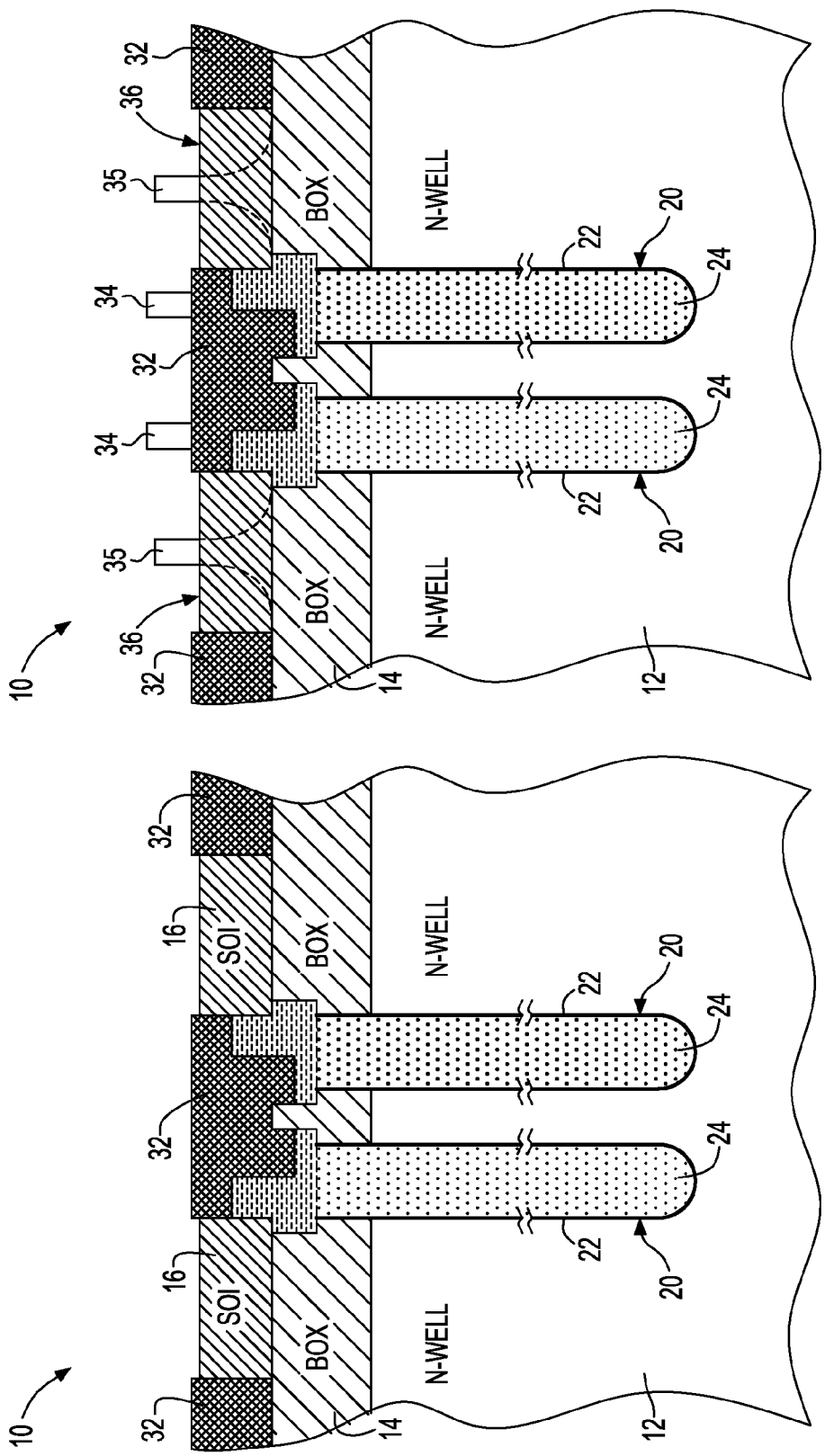

In the next processing step, the portion 33 (shown in FIG. 1B) of SOI layer 16 between the trenches 20 is removed, and STI oxide 32 is formed, for example, with well known high density plasma (HDP) oxide deposition and chemical-mechanical polishing process to complete the structure shown in FIG. 1C.

Finally, shown in FIG. 1D, passing wordlines 34 for the trenches 20 and gates 35 for the transistors 36 are formed.

The process of forming the eDRAM memory cell structure of the present invention now will be discussed. Referring now to FIG. 2A, there is shown a partially fabricated eDRAM memory cell structure on an SOI substrate 110 which comprises bulk silicon 112, buried oxide layer 114 and SOI layer 116. Layer 118 is a pad oxide layer and layer 119 is, for example, a nitride layer which forms a hard mask to facilitate the formation of the eDRAM memory cell structure on the SOI substrate 110. It is possible to add additional layer of hard mask for deeper trench formation, which is not shown in the drawings for clarity. Deep trenches 120 are reactive ion etched into the bulk silicon followed by doping of the bulk silicon to form a capacitor plate electrode with a typical doping process such as plasma doping or by deposition of doped glass followed by drive-in. Node dielectric 122 is conformally deposited on the walls of the trenches 120 and then, the two deep trenches 120 are filled preferably with doped polysilicon 124. Node dielectric 122 may be a metal oxide or a nitride oxide. The polysilicon 124 has been conventionally recessed as indicated by 126. It is to be noted that the polysilicon 124 is recessed only down to the SOI layer 116 as the present inventors desire to avoid any lateral etching of the BOX layer 114.

Thereafter, the node dielectric 122 is wet etched with hydrofluoric acid or phosphoric acid to form divot 128 as shown in FIG. 2B. A mixture of hydrofluoric acid and ethylene glycol can be used for wet etching of the node dielectric 122 as another example. The divot 128 is shown more clearly in FIG. 3. It is important to note that the depth of recess (the level difference between top surface of 126 and the bottom of SOI 116), which is hard to control by the nature of the dry etch process without an end point mechanism in general is not involved for the control of buried strap resistance in this invention. Instead, the depth of divot 128, which is relatively easy to control due to the small amount of divot depth compared to the depth of polysilicon recess depth (from top trench surface for the conventional process). As a result, the strap resistance can have a tighter distribution within wafer and within chip as an advantage of the present invention.

Next, as shown in FIG. 2C, the divot 128 is filled with doped polysilicon layer 130 which may be applied, for example, by a low pressure chemical vapor deposition (LPCVD) process. It is possible that the polysilicon layer 130 can be a metal or metal containing conductor material such as titanium nitride or tungsten nitride without hurting the concept of the present invention even though the primary fill material can be silicon containing the conductor material The doped polysilicon layer 130 will form the so-called buried strap to electrically connect the SOI layer 116 and the trench polysilicon 124 (also known as the deep trench electrode). The doped polysilicon layer 130 is shown more clearly in FIG. 4.

The shallow trench isolation region is next formed as shown in FIG. 2D. The previously deposited doped polysilicon layer 130 is lithographically masked so that in a following RIE step, part of the doped polysilicon 130 is removed as well as a portion of the polysilicon trench fill 124 and the overlying portion 134 (shown in FIG. 2C) of SOI layer 116. What remains of the doped polysilicon layer 130 is shown as buried strap 132 in FIG. 2D.

Figure 2E:
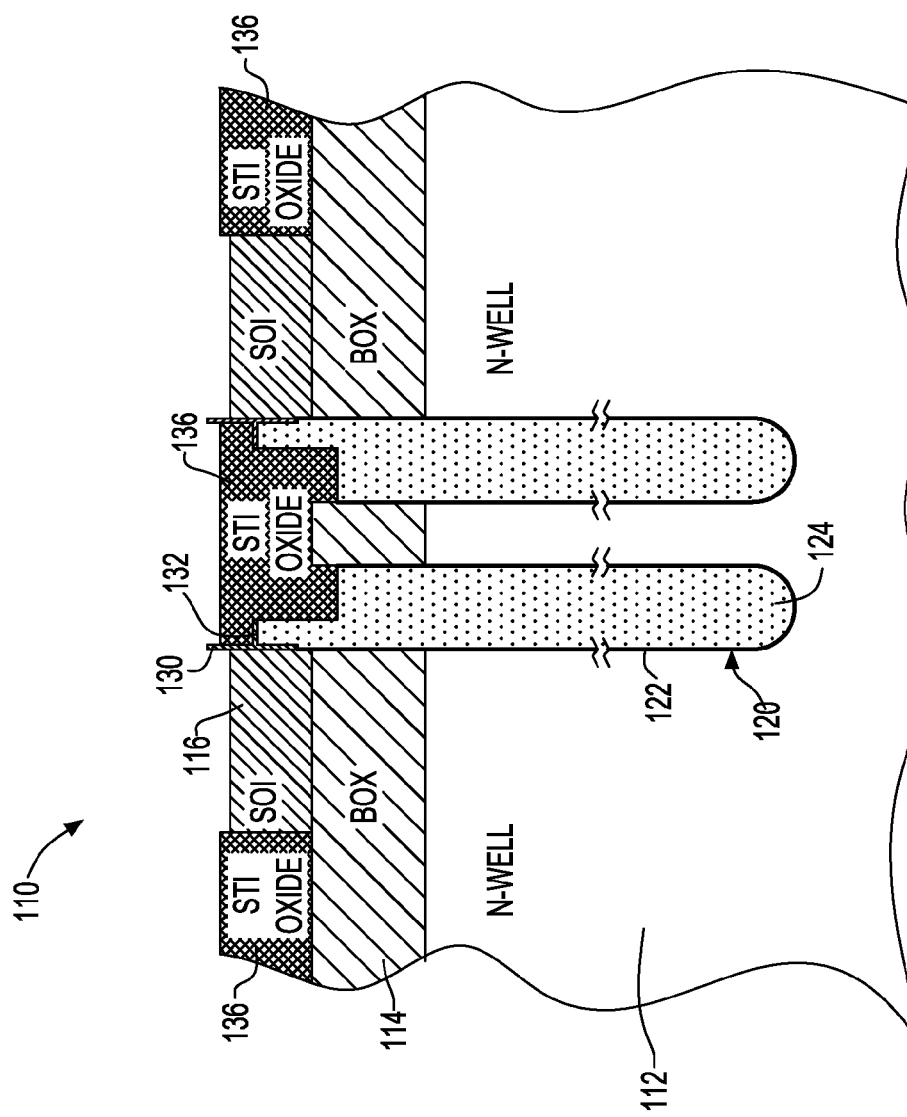

After deposition of STI oxide 136, the eDRAM memory cell structure is chemically—mechanically polished and then the nitride layer 119 is stripped to result in the structure shown in FIG. 2E.

Figure 2F:
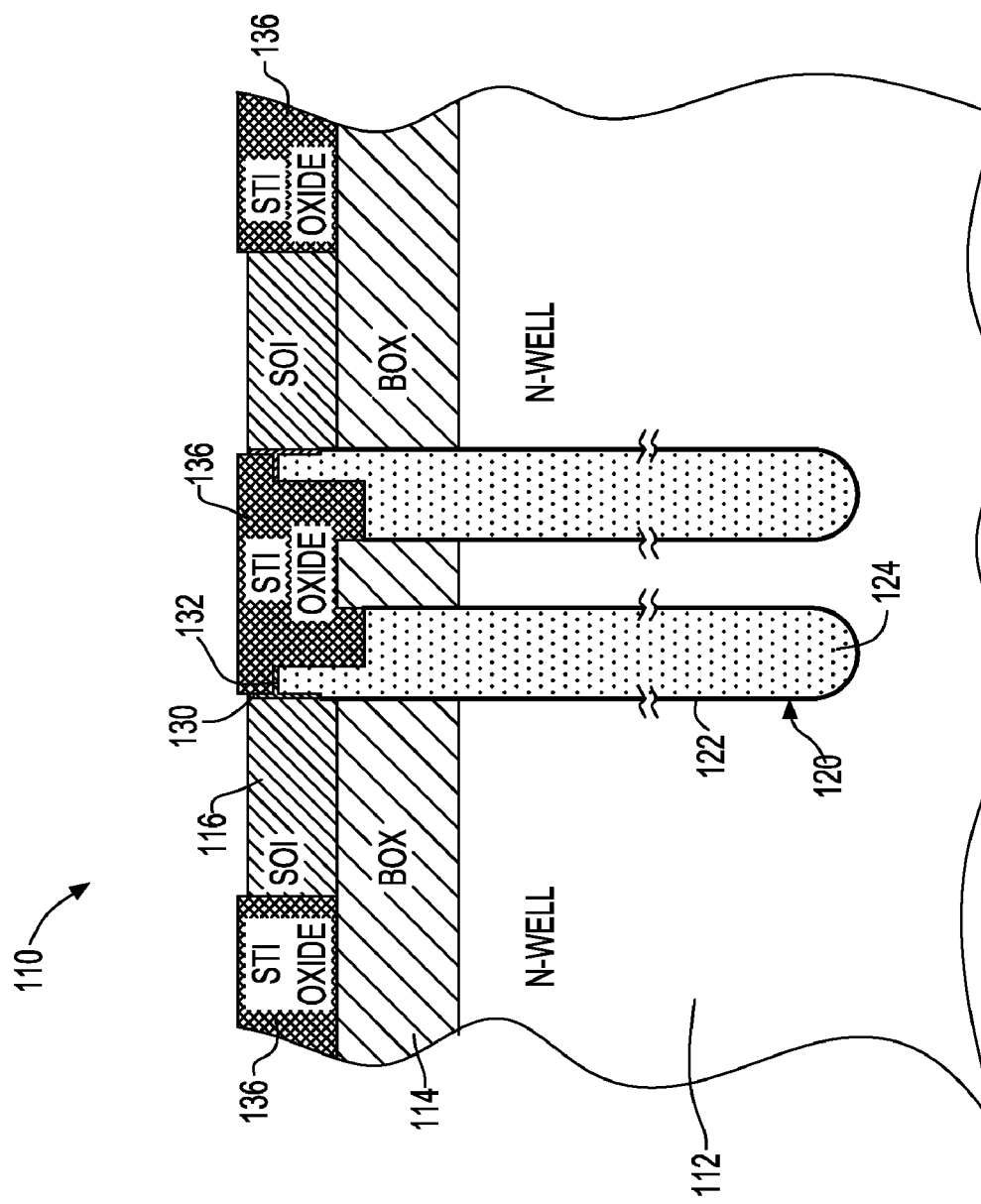

Referring now to FIG. 2F, the polysilicon layer 130 from FIG. 2E goes through an oxidation process to oxidize the silicon. Typical high temperature thermal oxidation in oxygen or steam ambient can convert the polysilicon layer 130 into thermal oxide with careful oxidation thickness control. The oxidized polysilicon can be etched away with hydrofluoric acid-containing wet etching, resulting in a buried strap connection 132.

Figure 2G:
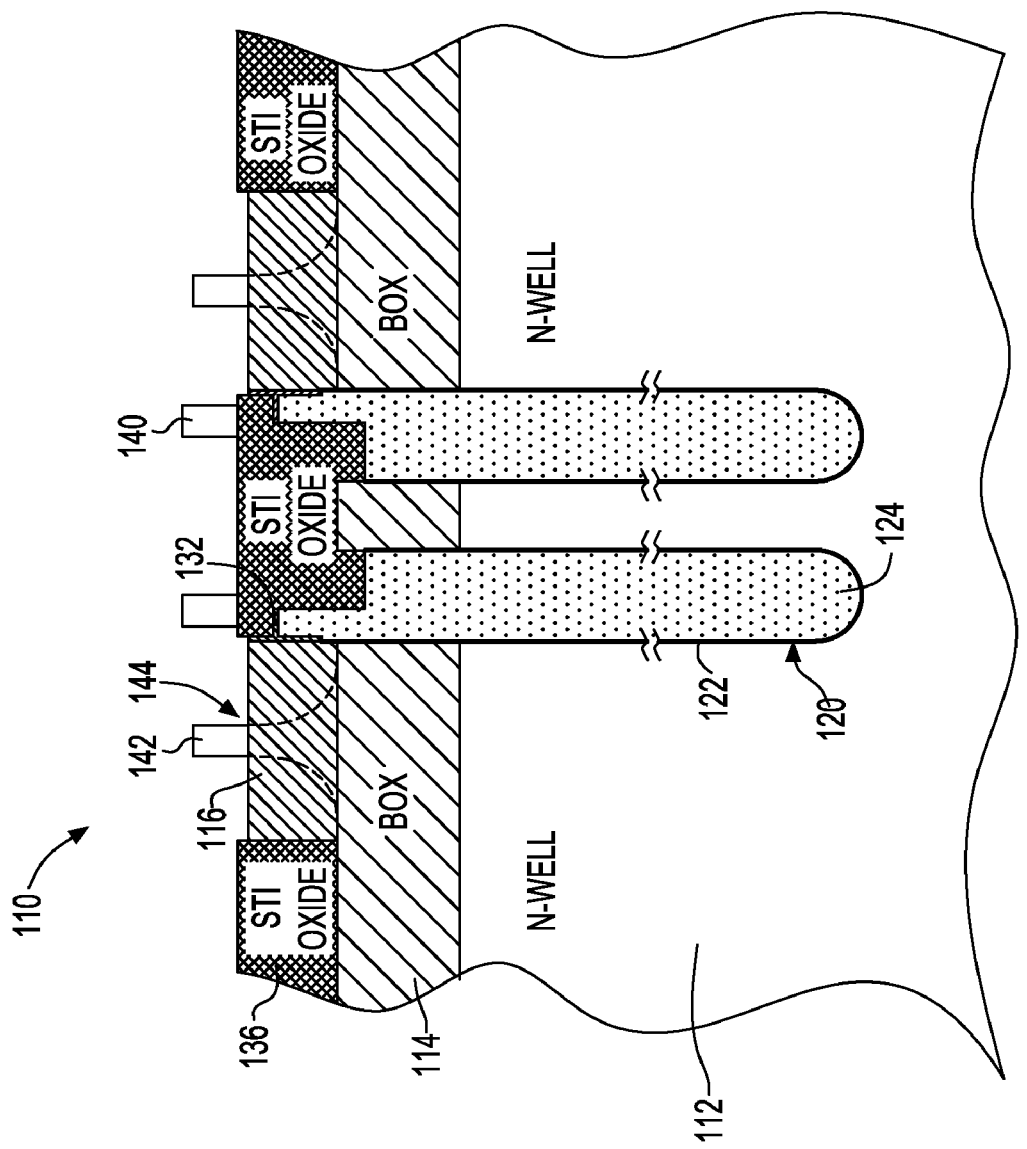

Lastly, in FIG. 2G, the passing wordlines 140 for the deep trenches 120 and gates 142 for transistors 144 are formed to complete the structure.

As can be seen, the eDRAM memory cell structure according to the present invention has been formed without adversely affecting the BOX layer.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

The invention claimed is:

1. A method for forming an eDRAM memory cell structure comprising the steps of:

forming a trench in a silicon on insulator (SOI) substrate comprising a bulk silicon layer, a buried oxide (BOX) layer and an SOI layer, the trench formed to a depth extending through the SOI layer and the BOX layer of the SOI substrate;

forming a node dielectric in the trench;

filling the trench with a first fill material;

recessing the first fill material to a level within the SOI layer;

recessing the node dielectric to form a divot;

filling the divot and forming a buried strap on the first fill material for making an electrical connection between the SOI layer and first fill material;

filling the trench with a second fill material; and forming a gate on the SOI layer and a passing wordline on the second fill material.

2. The method of claim 1 further comprising the step of avoiding etching the BOX layer during the steps of recessing the first fill material and recessing the node dielectric.

3. The method of claim 1 further comprising a second trench adjacent to the trench and wherein the BOX layer between the trench and the second trench is not laterally etched during the steps of recessing the first fill material and recessing the node dielectric.

4. The method of claim 1 wherein the first and second fill materials comprise doped polysilicon.

5. The method of claim 1 wherein the step of recessing the node dielectric is recessing the node dielectric to a level within the SOI layer.

6. The method of claim 1 wherein the step of filling the divot and forming a buried strap is by a conformal deposition process.

7. The method of claim 1 wherein the step of filling the divot and forming a buried strap includes forming the buried strap in the divot.

8. The method of claim 1 wherein forming a buried strap includes removing a portion of the buried strap and underlying first fill material prior to filling the trench with a second fill material.

* * * * *